US006522758B1

(12) United States Patent
Petroff

(10) Patent No.: US 6,522,758 B1
(45) Date of Patent: Feb. 18, 2003

(54) COMPENSATION SYSTEM FOR PLANAR LOUDSPEAKERS

(75) Inventor: Michael L. Petroff, West Hills, CA (US)

(73) Assignee: Sound Advance Systems, Inc., Santa Ana, CA (US)

( * ) Notice: Subject to any disclaimer, the term of this patent is extended or adjusted under 35 U.S.C. 154(b) by 0 days.

(21) Appl. No.: 09/376,652

(22) Filed: Aug. 18, 1999

(51) Int. Cl.$^{7}$ .................................................. H03G 5/00

(52) U.S. Cl. .......................................... 381/98; 381/431

(58) Field of Search ................................ 381/152, 431, 381/423, 97, 98, 101, 103, 111, 116–117, 56, 58, 59, 27, 99, 123; 181/148, 144, 145, 157, 167

(56) References Cited

U.S. PATENT DOCUMENTS

| | | | | |
|---|---|---|---|---|
| 4,053,711 A | | 10/1977 | DeFreitas et al. | 179/1 GQ |
| 4,569,076 A | * | 2/1986 | Holman | 381/82 |
| 4,908,858 A | | 3/1990 | Ohno | 381/1 |
| 4,933,786 A | | 6/1990 | Wilson | 360/78.14 |
| 4,997,058 A | * | 3/1991 | Bertagni | 181/166 |
| 5,185,679 A | * | 2/1993 | Mishima et al. | 360/30 |
| 5,210,796 A | | 5/1993 | Hirabayashi et al. | 381/12 |
| 5,216,718 A | | 6/1993 | Fukuda | 381/18 |
| 5,263,086 A | | 11/1993 | Yamazaki | 381/1 |
| 5,333,201 A | | 7/1994 | Waller, Jr. | 381/22 |
| 5,400,405 A | | 3/1995 | Petroff | 381/1 |
| 5,412,731 A | | 5/1995 | Desper | 381/1 |
| 5,524,053 A | | 6/1996 | Iwamatsu | 381/18 |
| 5,572,591 A | | 11/1996 | Numazu et al. | 381/1 |
| 5,592,558 A | | 1/1997 | Stuhlfener et al. | 381/18 |
| 5,638,452 A | | 6/1997 | Waller, Jr. | 381/22 |
| 5,657,391 A | | 8/1997 | Jyosako | 381/1 |
| 5,680,464 A | | 10/1997 | Iwamatsu | 381/18 |
| 5,872,851 A | | 2/1999 | Petroff | 381/18 |
| 5,970,153 A | | 10/1999 | Petroff | 381/17 |
| 6,038,323 A | | 3/2000 | Petroff | 381/1 |

FOREIGN PATENT DOCUMENTS

| | | | |
|---|---|---|---|
| CA | 1175362 | 10/1984 | 179/11 |

OTHER PUBLICATIONS

SA2B Accessories, Installation Compensation Circuit, Sound Advance Systems, Inc., May 1998.

Specification sheet, SA2B Accessories, Installation Compensation Circuit, Sound Advance Systems, Inc., May 1998 (two pages).

* cited by examiner

*Primary Examiner*—Curtis Kuntz
*Assistant Examiner*—Lun-See Lao
(74) *Attorney, Agent, or Firm*—Sheppard, Mullin, Richter & Hampton LLP

(57) ABSTRACT

A frequency response compensation system for use with a planar diaphragm speaker mounted in an architectural wall, ceiling or sealed enclosure having a depth dimension limited by the interior depth of the ceiling, wall or enclosure. The compensation system combines signals derived from a modified high-pass filter stage, an unmodified signal path, and a gyrator stage so as to phase-interact with one another and provide a complex transfer function. An underdamped high-pass filter stage further enhances low bass performance. The frequency compensation system includes a main circuit board and a series of daughter boards that are adapted to be releasably connected to the main board. Each of the daughter boards contains a set of passive components having different component values that determine the specific response parameters of the various stages and circuits of the compensation system and is optimized for a specific planar speaker and enclosure combination. A multi-section switch for selecting between different sets of component values may be substituted for the daughter boards.

13 Claims, 4 Drawing Sheets

COMPENSATION SYSTEM FOR PLANAR LOUDSPEAKERS

BACKGROUND OF THE INVENTION

This invention relates to a frequency response correction system, and, more particularly, to a system utilizing a combination of circuit stages configured to phase-interact with one another and compensate for the frequency response of a planar diaphragm speaker.

A variety of planar diaphragm loudspeakers have been developed in recent years using differing materials and having differing constructions and configurations. In general, such planar loudspeakers typically include a relatively stiff and substantially planar diaphragm that is coupled at its rear surface to a loudspeaker driver. The driver presses on the rear surface of the diaphragm and causes sufficient vibration of the diaphragm to efficiently produce sound. Generally, the frequency response of a planar loudspeaker is determined by the type and density of the material used for the diaphragm, and the area, thickness and contour of its sound producing region, as well as the type, position and configuration of the driver. Each of these parameters is chosen in an attempt to achieve an acceptable degree of fidelity in the reproduction of sound in both the low and high frequency ranges.

Some of the advantages provided by planar loudspeakers over other types of loudspeakers include greater dispersion of sound and economy of manufacture. A further advantage of certain planar loudspeakers is that the front surface of the diaphragm can be molded or finished to take on the appearance of a relatively large acoustic tile, permitting unobtrusive installation of the loudspeaker in ceilings of commercial structures formed of like-appearing acoustic tiles as part of a distributed sound system. Alternatively, the front surface of certain planar loudspeakers can be molded smooth and flat and installed in an architectural ceiling or wall in such a manner that the front surface of the planar diaphragm is flush with the front surface of the ceiling or wall. This type of installation of planar loudspeakers in walls or ceilings enables a common decorative finishing material to be applied to the diaphragm and surrounding ceiling or wall surface, thereby making the loudspeaker non-visible from the exterior side of the wall or ceiling. A number of such diaphragms can be joined together in a contiguous and seamless array to create a sound screen upon which video images can be projected as part of a home theater as shown and described in U.S. Pat. No. 5,007,707, which is assigned to the same assignee as the present application.

To comply with building and safety codes, the individual planar diaphragm loudspeakers of a distributed sound system may have to be surrounded on the rear side by a sealed metal enclosure or box. Whenever installed in an architectural wall or ceiling, whether or not in a separate sealed enclosure, there is usually a severe limitation in the depth of air space behind the planar diaphragm relative to the surface area of the diaphragm, which creates unusual and adverse acoustic conditions. These conditions typically result in an unacceptably high system resonant frequency ($F_r$), as well as an unacceptably high system resonant Q ($Q_f$). As a consequence, a response peak typically occurs in a mid-bass region, and low bass frequency response is typically deficient. For example, the response peak for a planar diaphragm loudspeaker in an air chamber having a limited depth dimension might be in the range of 125 to 200 Hz., whereas preferably it would be in the range of 25 to 50 Hz.

The degree to which $F_r$ and $Q_f$ parameters are non-optimal varies with specific planar diaphragm speaker design characteristics and the air chamber behind such speaker. In general, a product line might include several planar diaphragm speakers having different size diaphragms, and each of those speakers may have several different metal enclosures or boxes from which to choose depending on where the speaker assembly is installed. It would be desirable, therefore, if the signal compensation for non-optimal $F_r$ and $Q_f$ parameters could be calibrated to the specific planar diaphragm speaker/air chamber combination.

Another characteristic of planar diaphragm speakers mounted in air chambers with a limited depth dimension is that they often exhibit an integrated power response decline in a mid-treble region (e.g., about 5 kHz.) and an integrated power response rise in a high-treble region (e.g., above 10 kHz.), which in turn degrades mid-range and treble reproduction accuracy. Again, the degree to which such mid-treble and high-treble responses are non-optimal varies with specific planar diaphragm speaker design characteristics and the associated air chamber. Signal compensation for non-optimal mid-treble and high-treble characteristics preferably should also be calibrated to the specific planar diaphragm speaker/air chamber combination.

One known way of compensating for the frequency response characteristics of loudspeakers involves use of graphic and parametric equalizers. However, such equalizers require intricate and painstaking alignments at multiple frequency points since the adjustment of one frequency band tends to interfere with other frequency band adjustments, making it difficult to set relatively sharp frequency cut-offs. Moreover, such equalizers are relatively expensive. Consequently, the use of such equalizers is not considered to be a very convenient or desirable solution to the problem of compensating for the above-described frequency response characteristics of planar diaphragm speakers mounted in air chambers with a limited depth dimension. This is particularly so for a distributed system of planar diaphragm speakers in which there might be a variety of different planar diaphragm speaker/air chamber combinations, each with its own compensation requirements.

Another way of compensating for the frequency response characteristics of planar diaphragm loudspeakers is described in co-pending application Ser. No. 09/099,049. This system incorporates cascaded equalization circuits and includes, among other elements, a multi-section switch in a resonant circuit to enable single-control selection of pre-set amplitude (A), frequency (F) and bandwidth (Q) parameters corresponding to various enclosure depths. As a practical matter, however, this system provides frequency compensation characteristics that are more suited to a home theater application than to distributed sound applications of planar diaphragm speakers.

Accordingly, there is a need for a method and apparatus for compensating for one or more of the above deficiencies in the frequency response of planar loudspeakers when mounted in air chambers with a limited depth dimension that can be calibrated for a specific planar diaphragm speaker/air chamber combination in a simple and cost effective manner. The present invention fulfills these and other needs.

SUMMARY OF THE INVENTION

Briefly, and in general terms, the present invention resides in a novel system for compensating the frequency response characteristics of a planar diaphragm speaker mounted in an air chamber with a limited depth dimension. The system may include one or more unconventional frequency compensation stages or circuits for processing an audio source signal applied to a planar diaphragm speaker/air chamber combination. The system also may be implemented in a manner that easily and economically allows calibration or adjustment of the frequency compensation characteristics of the system to accommodate a variety of different planar diaphragm speaker/air chamber combinations.

More specifically, the present invention provides electronic compensation, in an unconventional manner, for unacceptably high system resonance frequency and system resonant Q parameters of a planar diaphragm speaker mounted in an air chamber having a relatively small depth dimension. The present invention also may provide electronic compensation for a decline in integrated power response in a mid-treble region and a rise in integrated power response in a high-treble region of a planar diaphragm speaker.

In a presently preferred embodiment, and by way of example only, the compensation stages or circuits of the system of the present invention may be derived from a modified second-order, high-frequency high-pass filter stage and a linear frequency path in an additive manner, and a signal derived from a mid-frequency gyrator stage in a subtractive manner, so as to phase-interact with one another and provide a corrective transfer function. Such transfer function serves to correct the unacceptably high system resonant frequency ($F_r$) and system resonant Q ($Q_r$) parameters that occur in planar diaphragm speakers mounted in air chambers having a relatively small depth dimension.

The above modified second-order, high-frequency high-pass filter may be eliminated, substituted by a non-modified high-pass filter, or substituted by other order modified or non-modified high-pass filters. In addition, an underdamped high-pass filter stage may be applied to the source input signal as a means to further enhance low bass performance in a frequency region below $F_r$. In an alternative embodiment, such underdamped filter stage may be applied to the system output signal. The transfer function of the compensation circuits also may serve to correct the integrated power response decline in a mid-treble region and the integrated power response rise in a high treble region typical of planar loudspeakers mounted in air chambers with a limited depth dimension. Each stage or circuit may be implemented in either the analog or digital domain.

In a further aspect of the present invention, the system may be configured to allow or provide for a plurality of frequency response compensation characteristics, each adapted or calibrated to optimize a specific planar diaphragm speaker/air chamber combination. This may be accomplished by substitution or adjustment of one or more components of the circuitry in order to tailor the system response for a specific planar diaphragm speaker/air chamber combination. In a preferred embodiment, for example, selected circuit components may reside on one or more auxiliary members in the form of parts carriers or "daughter" boards or other structures that can be plugged into or otherwise releasably connected to a main or "mother" board where the remainder of the frequency compensation circuitry resides. Each parts carrier or board may comprise circuit components with values that determine the response parameters of at least one of the above-described stages of the system of the present invention. Preferably, the parts carrier or daughter board will include passive circuit components only, and a single parts carrier or daughter board may include components for each of the stages or circuits that need to be calibrated or adjusted for a particular planar diaphragm speaker/air chamber combination. An appropriate number of such parts carriers or boards can be devised to accommodate all of the combinations of planar diaphragm speakers and metal enclosures or boxes (or other air chambers) in a product line. Thus, by plugging or otherwise connecting a parts carrier or daughter board to the main board, the system can be calibrated or adjusted to a specific planar diaphragm speaker/air chamber combination. Alternatively, a multi-section switch for selecting such circuit component values, or combinations of values, may substitute for the parts carriers or boards, if desired.

These and other advantages of the invention will become apparent from the following detailed description of the preferred embodiments, taken in conjunction with the accompanying drawings, which illustrate, by way of example, the principles of the invention.

DETAILED DESCRIPTION OF THE DRAWINGS

Figure 1:
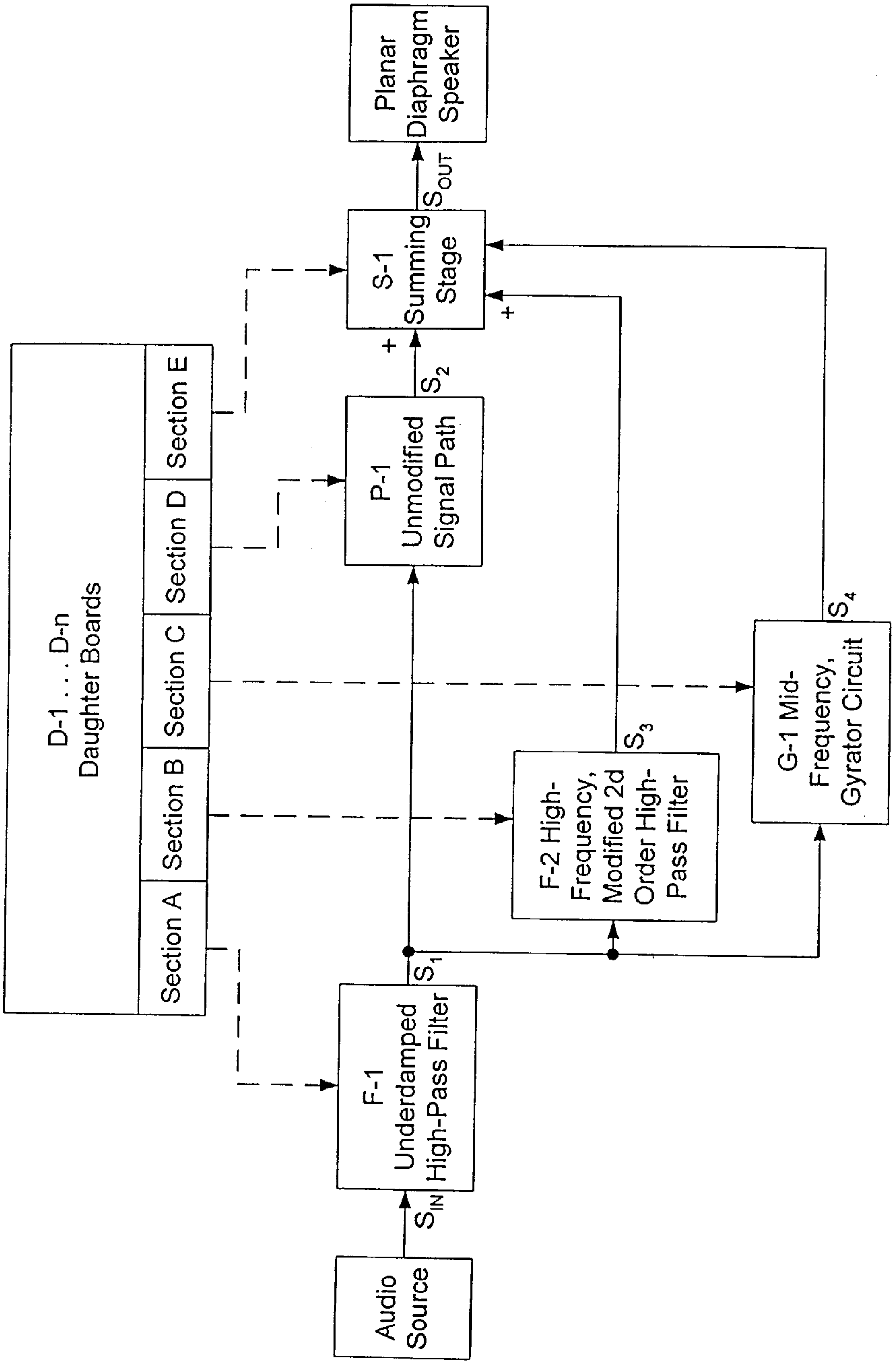
FIG. 1 is a block diagram of the preferred embodiment of the frequency compensation system of the present invention.

Referring now to the drawings, and particularly to FIG. 1, there is shown a block diagram of the preferred embodiment of the present invention, in which frequency response compensation is provided for one or more of a multiplicity of planar diaphragm speaker and enclosure combinations. The purpose of FIG. 1 is to compensate for the undesirable frequency response characteristics of an uncompensated planar diaphragm speaker mounted in an enclosure having a limited depth dimension, such as illustrated in FIG. 2.

Figure 2:
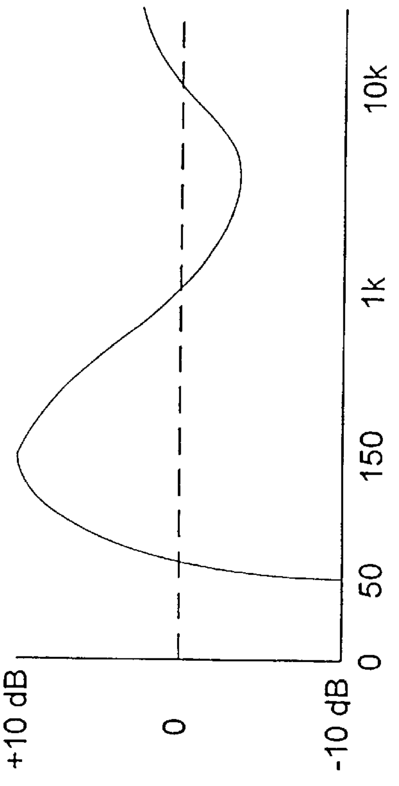
FIG. 2 is a graph of the on-axis frequency response of an uncompensated planar diaphragm speaker mounted in an enclosure having a limited depth dimension.

As seen in FIG. 2, a typical planar diaphragm speaker mounted in an enclosure having a limited depth dimension has an unacceptably high system resonant frequency ($F_r$) and an unacceptably high system resonant Q ($Q_f$), resulting in a response peak in the range of 125 to 200 Hz. and essentially no response at all below approximately 50 Hz. Preferably the response peak for the speaker would be in the range of 25 to 50 Hz., and its low bass frequency response would extend well below 50 Hz. Moreover, it can be seen in FIG. 2 that the uncompensated planar diaphragm speaker exhibits an integrated power response decline in a mid-treble region of approximately 5 kHz. and an integrated power response rise in a high-treble region above approximately 10 kHz. This, in turn, degrades the mid-range and treble reproduction accuracy of the speaker.

Referring again to FIG. 1, the preferred embodiment of the frequency compensation system includes three stages. The first stage comprises an underdamped high-pass filter F-1. The second stage comprises a parallel configuration of an unmodified signal path P-1, a modified second-order, high-frequency high-pass filter F-2, and a mid-frequency gyrator circuit G-1. The third stage is a summing stage S-1.

Also indicated in FIG. 1 is a set of daughter boards D-1 . . . D-n, each of which is divided into sections A through E. Each daughter board carries some of the components of the foregoing stages or circuits that determine their specific frequency response characteristics. By selection of the appropriate daughter board, the frequency response of each individual stage or circuit and, therefore, their phase interactions and the overall frequency response or transfer function of the entire frequency compensation system can be adjusted or tailored for a specific planar diaphragm speaker/air chamber combination, as described in more detail below.

The operation of the frequency compensation system of FIG. 1 is as follows. An input signal $S_{IN}$ from a suitable audio source, such as a pre-amplifier or other line-level source of a sound system, is applied to the underdamped high-pass filter F-1 of the first stage. Stage F-1 applies a low-frequency boost response, as represented by response curve "a" in FIG. 3, to signal $S_{IN}$, thereby producing output signal $S_1$. By way of example, such boost is shown as approximately 15 dB at approximately 65 Hz.

Signal $S_1$ from the underdamped high-pass filter F-1 is then simultaneously applied as an input signal to the unmodified signal path P-1, the modified second-order, high-frequency high-pass filter F-2, and the mid-frequency gyrator circuit G-1.

Figure 3:
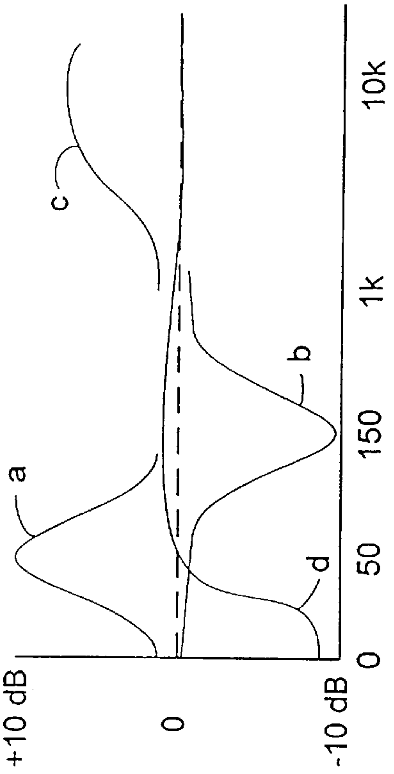
FIG. 3 is a graph of the frequency responses of various stages or circuits of the frequency compensation system shown in FIG. 1, in which curve "a" is the frequency response of an underdamped high-pass filter, curve "b" is the frequency response of a mid-frequency gyrator circuit; curve "c" is the frequency response of a modified second-order, high-frequency high-pass filter, and curve "d" is the frequency response of a non-modified signal path.

The unmodified signal path stage P-1 applies one of an attenuated and non-attenuated path to signal $S_1$, as represented by curve "d" in FIG. 3, thereby producing output signal $S_2$. Curve "d" in FIG. 3 shows the frequency response when an attenuated path is applied to signal $S_1$.

The modified second-order, high-frequency high-pass filter stage F-2 applies a high-frequency, high-pass filter function and a gradual ultra-high-frequency roll-off to signal $S_1$, as represented by curve "c" in FIG. 3, thereby producing output signal $S_3$. By way of example, a second-order cut-off below approximately 5 kHz. and a gradual roll-off above 5 kHz. is shown.

The mid-frequency gyrator circuit stage G-1 applies a mid-frequency peak to signal $S_1$, thereby producing output signal $S_4$. By applying signal $S_4$ to the converting rather than non-inverting input of the summing stage S-1, signal $S_4$ is converted to a corresponding mid-frequency dip in signal $S_1$, as represented by curve "b" in FIG. 3. By way of example, the dip is shown as approximately 15 dB at about 200 Hz.

Figure 4:
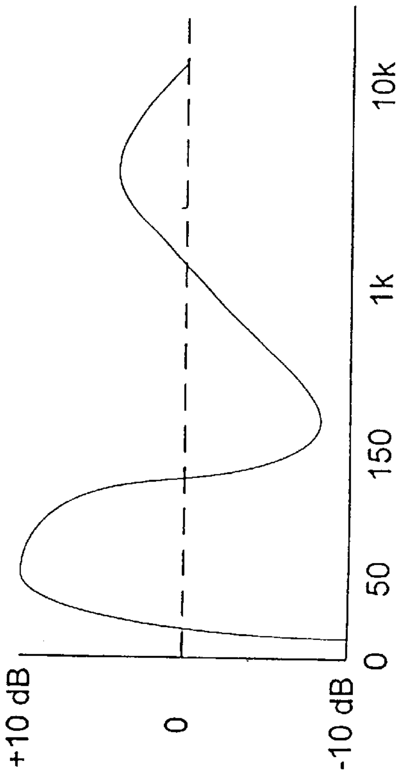
FIG. 4 is a graph of the complex transfer function resulting from the combined, phase-interacting responses shown in curves "a"–"d" of FIG. 3.
Figure 5:
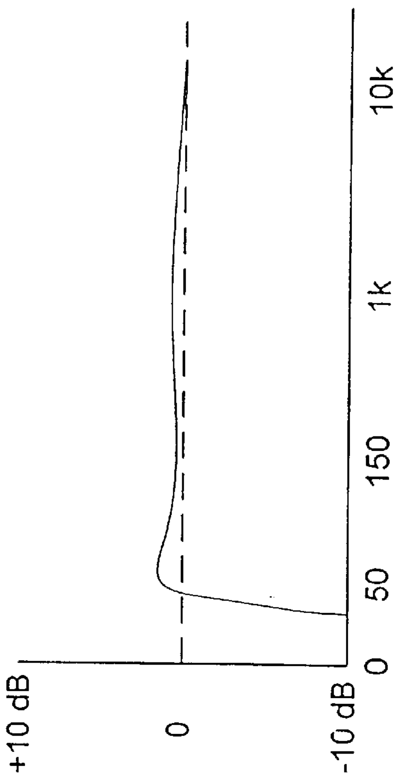
FIG. 5 is a graph of the corrected on-axis frequency response of a planar diaphragm speaker mounted in an enclosure having a limited depth dimension resulting from the transfer function shown in FIG. 4.

Signals $S_2$ and $S_3$ are then applied in an additive manner to non-inverting inputs of summing stage S-1, and, as noted, signal $S_4$ is applied in a subtractive manner to the inverting input of the summing stage S-1. Signals $S_2$, $S_3$ and $S_4$ thereby sum and phase interact with one another to produce a corrective transfer function, as represented in FIG. 4, which is provided as output signal $S_{OUT}$ to a planar diaphragm loudspeaker or loudspeaker system. This results in a corrected on-axis frequency response as shown in FIG. 5. It is evident that the corrected on-axis frequency response of the planar diaphragm speaker or system of speakers, mounted in enclosures having a limited depth dimension, thereby exhibits a significant improvement in frequency response accuracy.

Figure 6:
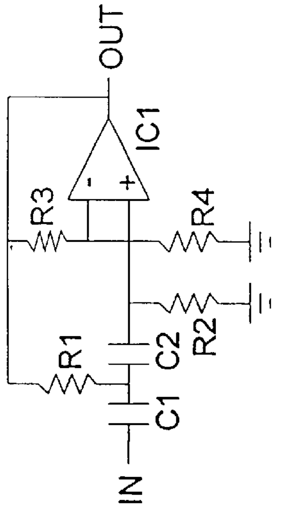
FIG. 6 is a schematic diagram of an underdamped high-pass filter circuit suitable for use in the frequency compensation system shown in FIG. 1.

Turning now to FIGS. 6–10, there are shown schematic diagrams of various circuits that are suitable for use in the compensation system of FIG. 1. Specifically, FIG. 6 is a schematic diagram of a circuit that is suitable for the underdamped high-pass filter F-1. An operational amplifier, or op-amp, IC1 processes an input signal to produce a filtered and peaked output signal, capacitors C1 and C2 and resistors R1 and R2 determine the filter cut-off frequency, and resistors R3 and R4 determine the amplitude of the peak.

Figure 7:
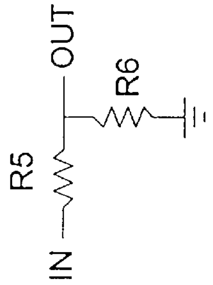
FIG. 7 is a schematic diagram of an unmodified signal path suitable for use in the frequency compensation system shown in FIG. 1.

A schematic diagram of a circuit that is suitable for the unmodified signal path P-1 is shown in FIG. 7. An input signal is processed by resistors R5 and R6 to provide an output signal equal to a sample of the input signal.

Figure 8:
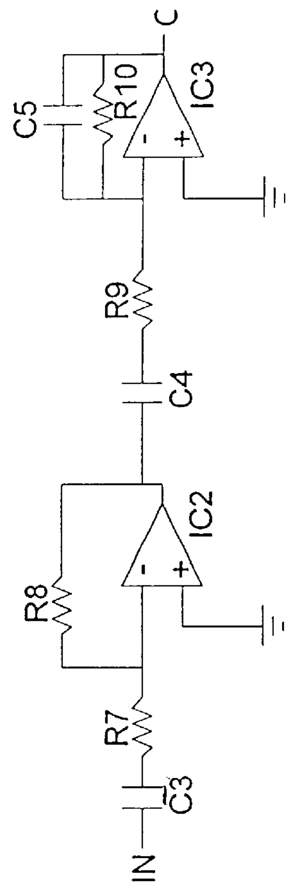
FIG. 8 is a schematic diagram of a modified second-order, high-frequency high-pass filter suitable for use in the frequency compensation system shown in FIG. 1.

FIG. 8 is a schematic diagram of a circuit that is suitable for the modified second-order, high-frequency high-pass filter F-2. An input signal is sequentially applied to a capacitor C3, a series resistor R7, a feedback resistor R8 and an input of an op-amp IC2. Op-amp IC2 thereby provides a first-order high-pass filtered signal that is sequentially applied to a capacitor C4, a series resistor R9, a feedback resistor R10 and an input of an op-amp IC3. Op-amp IC3 thereby provides as output a second-order high-pass filtered signal, in which the shape of the filter cut-off slope is determined by the cut-off frequency alignment of the two above-described cascaded filter stages. The output signal is further modified by a feedback capacitor C5, which operates with op-amp IC3 to provide a gradual decline in the output signal at very high frequencies.

Figure 9:
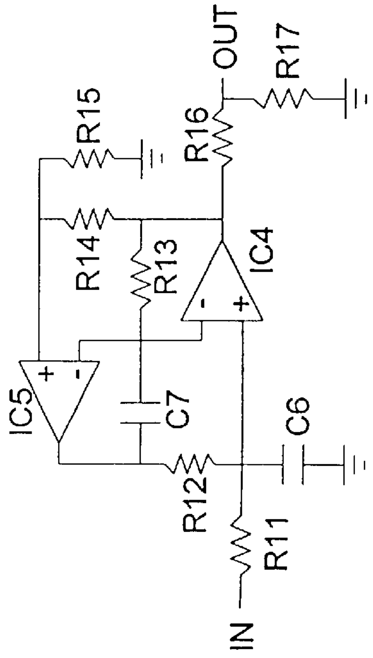
FIG. 9 is a schematic diagram of a mid-frequency gyrator circuit suitable for use in the frequency compensation system shown in FIG. 1.

A schematic diagram of a circuit that is suitable for the mid-frequency gyrator circuit G-1 is shown in FIG. 9. An input signal is sequentially applied to a resistor R11, a capacitor C6 and an input of an op-amp IC4. Op-amp IC4 provides an output signal that is simultaneously applied to a feedback resistor R13 and a series resistor R14. Resistor R14 and a resistor R15 provide an attenuated sample of the IC4 output signal to an input of an op-amp IC5. Op-amp IC5 provides an output signal that is simultaneously applied to a feedback capacitor C7 and to an input of op-amp IC4 through a series resistor R12. The output of op-amp IC4 is applied to voltage divider resistors R16 and R17, which provide an attenuated gyrator circuit output signal. Such gyrator circuit provides a resonant amplitude peak transfer function to the input signal, which peak is converted to an amplitude dip by means of inverted signal summing processes described below. The frequency of the dip is determined by resistor R12 and capacitors C6 and C7; the Q of the dip is determined by resistor R11; and the amplitude of the dip is determined by resistors R16 and R17.

Figure 10:
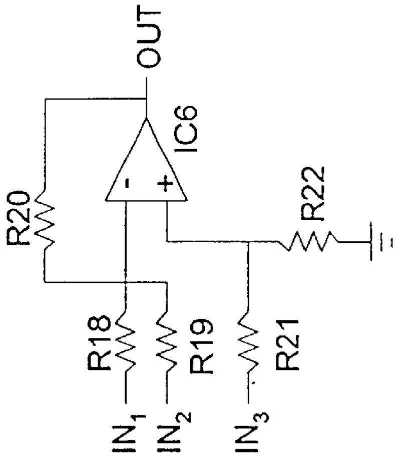
FIG. 10 is a schematic diagram of a summing stage suitable for use in the frequency compensation system shown in FIG. 1.

Finally, FIG. 10 is a schematic diagram of a circuit that is suitable for the summing stage S-1. An op-amp IC6 combines input signals $IN_1$ and $IN_2$ in an additive manner and input signal $IN_3$ in a subtractive manner, using a conventional arrangement of input and feedback resistors R18, R19, R20, R21 and R22, to produce an output signal equal to a phase-interactive combination of the input signals.

As discussed above, one of a series of daughter boards D-1 . . . D-n may interface with one or more the above-described stages or circuits that make up the frequency compensation system of FIG. 1. Each such daughter board may comprise a board or other unit on which one or more components from these stages or circuits are operably mounted. Any one of these daughter boards can then be plugged into or otherwise releasably connected to a main board on which the remaining components of the stages or circuits are contained. Each daughter board may comprise a standard parts carrier that plugs into a standard IC socket on the main board.

The components relating to each separate stage or circuit are included in a section of the daughter board devoted to that stage or circuit. Assuming that the daughter board includes components for all five stages or circuits of the system (F-1, F-2, G-1, P-1 and S-1), there will be five corresponding sections A–E, respectively. Each section includes one or more passive components (e.g., resistors and/or capacitors) for each stage or circuit. For example, section A for the underdamped high-pass filter F-1 may include some or all of capacitors C1 and C2 and resistors R1 and R2, which determine the filter cut-off frequency, and resistors R3 and R4, which determine the amplitude of the peak. Similarly, section C for the mid-frequency gyrator circuit G-1 may include one or more of resistor R12 and capacitors C6 and C7, which determine the frequency of the dip; resistor R11, which determines the Q of the dip; and resistors R16 and R17, which determine the amplitude of the dip. Such components may optionally include at least one active component (e.g., IC1–IC6) ordinarily mounted on the main board.

When daughter board D-1 is plugged into the main board, each section A–E separately interfaces with, and thereby determines the frequency response characteristics of, the stage or circuit to which it corresponds. The combined effects of the various sections of daughter board D-1, therefore, determines the overall frequency response characteristic or transfer function of the frequency compensation system. Similarly, each of the other daughter boards D-2 . . . D-n contains its own unique combination of components to calibrate or adjust the frequency response characteristics of one or more stages or circuits. In this manner, a set of daughter boards D-1 . . . D-n can be created to accommodate all of the combinations of planar diaphragm speakers and metal enclosures or boxes (or other air chambers) in a product line. By plugging in or otherwise connecting the appropriate daughter board to the main board, therefore, the system can be calibrated or adjusted to a specific planar diaphragm speaker/air chamber combination.

In the alternative, a multi-section switch can be substituted for daughter boards D-1 . . . D-n in FIG. 1 and utilized for selecting the different combinations of components for the various stages or circuits of the frequency compensation system. However, to achieve the same degree of adjustability, this approach would require that each frequency compensation system include all of the components from each of the daughter boards D-1 . . . D-n, as well as a switch having both the same number of positions as the number of daughter boards and the same number of sections as the number of sections on each daughter board. Therefore, in general, the use of such a switch would not be as economical as the use of the daughter boards.

Figure 11:
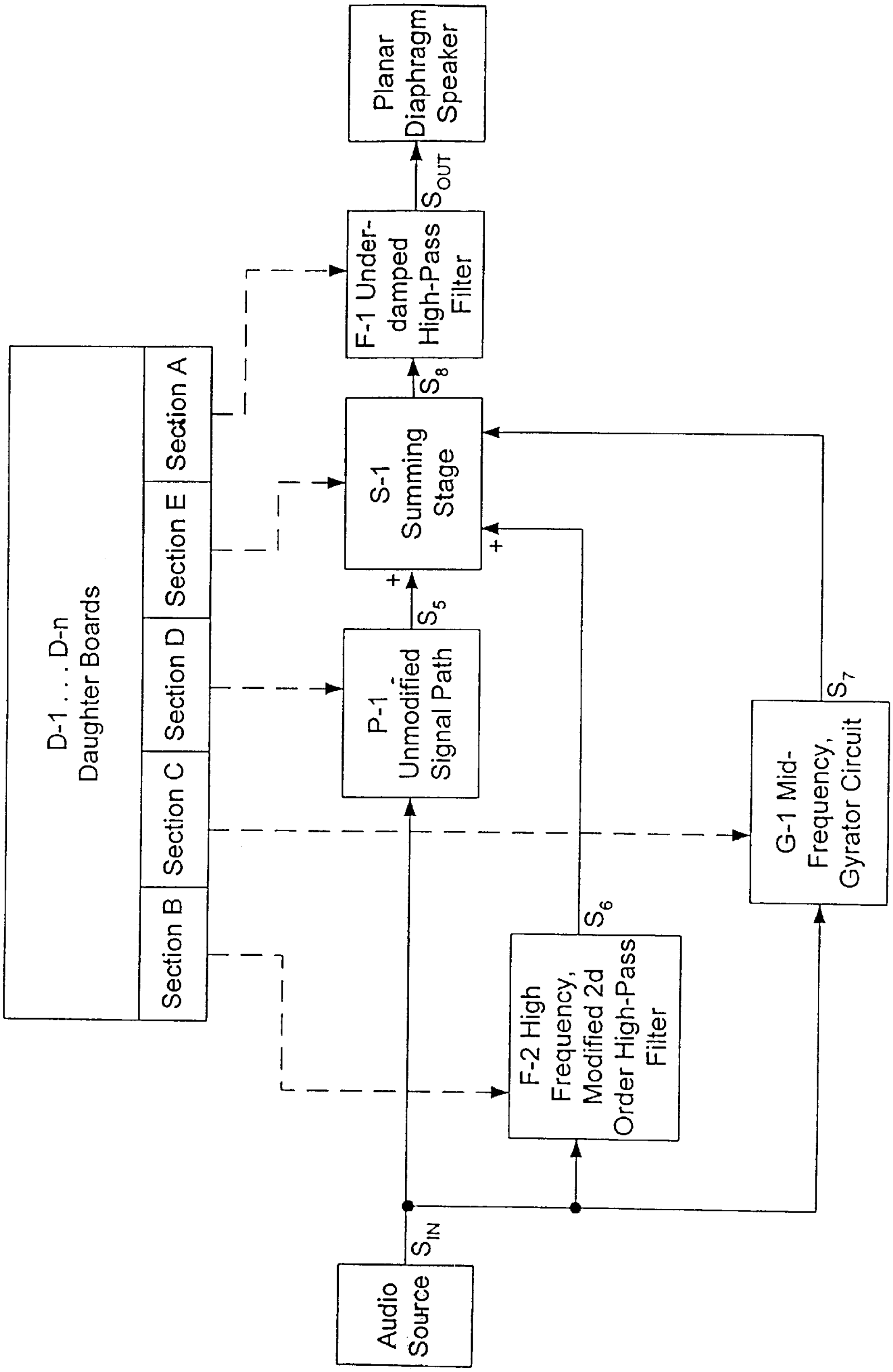
FIG. 11 is a block diagram of an alternative embodiment of a frequency compensation system in accordance with the present invention.

An alternative embodiment of a frequency compensation system of FIG. 1 is shown in FIG. 11. The alternative embodiment in FIG. 11 is similar to the system shown in FIG. 1, except that the underdamped high-pass filter stage F-1 is utilized to process the output signal rather than the input signal. Otherwise, the system of FIG. 11 is constructed and functions in a manner similar to the system of FIG. 1 and produces a similar result.

Specifically, in the system of FIG. 11 input signal $S_{IN}$ is simultaneously applied as an input signal directly to the unmodified signal path P-1, the modified second-order, high-frequency high-pass filter F-2, and the mid-frequency gyrator circuit G-1. The unmodified signal path stage P-1 applies one of an attenuated and non-attenuated path to signal $S_{IN}$, thereby producing output signal $S_5$. The modified second-order, high-frequency high-pass filter stage F-2 applies a high-frequency, high-pass filter function and a gradual ultra-high-frequency roll-off to signal $S_{IN}$, thereby producing output signal $S_6$. The mid-frequency gyrator circuit stage G-1 applies a mid-frequency peak to signal $S_{IN}$, thereby producing output signal $S_7$, which, because it is applied to the inverting input of the summing stage S-1, is converted to a corresponding mid-frequency dip in signal $S_{IN}$. Signals $S_5$ and $S_6$ are applied in an additive manner to non-inverting inputs of summing stage S-1, and signal $S_7$ is applied in a subtractive manner to the inverting input of the summing stage S-1. Summing stage S-1 produces output signal $S_8$ that is applied as an input signal to underdamped high-pass filter stage F-1, which provides a low-frequency boost response and produces output signal $S_{OUT}$.

Those of ordinary skill in the art will appreciate from the foregoing description that the present invention provides for a simple and economical system that effectively compensates for the diminished sound reproduction capabilities of planar diaphragm loudspeakers mounted in air chambers having a limited depth dimension, and that can be readily and economically calibrated for a variety of specific planar diaphragm speaker/air chamber combinations. While particular forms of the invention have been illustrated and described, it will be apparent that this invention may be embodied and practiced in other specific forms, e.g., in analog or functionally equivalent digital implementation, without departing from the spirit and essential characteristics thereof. The present embodiments are therefore to be considered in all respects as illustrative and not restrictive, the scope of the invention being indicated by the appended claims rather than by the foregoing description, and all variations, substitutions and changes which come within the meaning and range of equivalency of the claims are therefore intended to be embraced therein.

What is claimed is:

1. In an audio system including an audio source and a planar diaphragm loudspeaker for producing sound in response to an audio signal from the audio source, the improvement comprising a frequency compensation system interposed between the audio source and the planar diaphragm loudspeaker for electronically compensating frequency response deficiencies in the planar diaphragm loudspeaker, wherein the frequency compensation system combines signals derived from a high-frequency high-pass filter and an unmodified signal path in an additive manner, and a signal derived from a mid-frequency gyrator circuit in a subtractive manner, such that the signals phase-interact with one another and provide a complex transfer function.

2. A frequency response compensation system as set forth in claim 1, wherein the system provides compensation for unacceptably high resonant frequency and resonant Q parameters associated with the planar diaphragm loudspeaker.

3. A frequency response compensation system as set forth in claims 1 or 2, wherein the system provides compensation for a decline in integrated power response in a mid-treble region and a rise in integrated power response in a high-treble region associated with the planar diaphragm loudspeaker.

4. A frequency compensation system as set forth in claim 1, wherein the high-frequency high-pass filter stage provides a gradual roll-off in a very high frequency region.

5. A frequency compensation system as set forth in claim 1, wherein the high-frequency high-pass filter is a second order filter.

6. A frequency compensation system as set forth in claim 1, and further including an underdamped high-pass filter.

7. A frequency compensation system as set forth in claim 6, wherein the underdamped high-pass filter is arranged to process an input signal applied to the system.

8. A frequency compensation system as set forth in claim 6, wherein the underdamped high-pass filter is arranged to process an output signal provided by the system.

9. A frequency compensation system for electronically compensating frequency response deficiencies in a planar diaphragm loudspeaker, the system comprising:

a high-frequency high-pass filter;

an unmodified signal path;

a mid-frequency gyrator circuit; and a summing circuit, wherein each of the high-frequency high-pass filter, the unmodified signal path and the mid-frequency gyrator circuit receives and processes an input signal, and further wherein the summing circuit combines an output signal from each of the high-frequency high-pass filter and the unmodified signal path in an additive manner, and an output signal from the mid-frequency gyrator circuit in a subtractive manner, such that the output signals phase-interact with one another and provide a complex transfer function.

10. A frequency compensation system as set forth in claim 9, wherein the high-frequency high-pass filter, the unmodified signal path, and the mid-frequency gyrator circuit each receive and process the same input signal.

11. A frequency compensation system as set forth in claim 9, and further including an underdamped high-pass filter.

12. A frequency compensation system as set forth in claim 11, wherein the underdamped high-pass filter is arranged to process each of the input signals applied to the high-frequency high-pass filter, the unmodified signal path and the mid-frequency gyrator circuit.

13. A frequency compensation system as set forth in claim 11, wherein the underdamped high-pass filter is arranged to process an output signal provided by the summing circuit.

* * * * *